(12) United States Patent
Uchida

(10) Patent No.: US 7,688,875 B2
(45) Date of Patent: Mar. 30, 2010

(54) VERTICAL CAVITY SURFACE EMITTING LASER ARRAY AND METHOD FOR MANUFACTURING, AND IMAGE FORMING APPARATUS USING VERTICAL CAVITY SURFACE EMITTING LASER ARRAY

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 131 days.

(21) Appl. No.: 12/167,427

(22) Filed: Jul. 3, 2008

(65) Prior Publication Data

US 2009/0010297 A1  Jan. 8, 2009

(30) Foreign Application Priority Data

Jul. 5, 2007 (JP) ............... 2007-176969

(51) Int. Cl.
*H01S 5/00* (2006.01)
(52) U.S. Cl. ............... 372/50.12; 372/50.124
(58) Field of Classification Search ............ 372/29.015, 372/50.124, 50.12, 12
See application file for complete search history.

(56) References Cited

U.S. PATENT DOCUMENTS

| | | | |
|---|---|---|---|
| 6,033,632 A | * | 3/2000 | Schwartz et al. ............ 422/190 |
| 6,222,868 B1 | | 4/2001 | Ouchi et al. ............... 372/50 |
| 2003/0095582 A1 | * | 5/2003 | Ackley .................... 372/108 |
| 2007/0201527 A1 | | 8/2007 | Hori et al. ............ 372/50.124 |
| 2008/0031297 A1 | | 2/2008 | Uchida .................. 372/45.01 |

FOREIGN PATENT DOCUMENTS

| | | |
|---|---|---|
| JP | 11-168262 | 6/1999 |
| JP | 2007-5386 | 1/2007 |

* cited by examiner

*Primary Examiner*—Minsun Harvey
*Assistant Examiner*—Tuan N. Nguyen
(74) *Attorney, Agent, or Firm*—Fitzpatrick, Cella, Harper & Scinto

(57) ABSTRACT

A vertical cavity surface emitting laser array is disclosed which allows wires for individually driving devices arrayed at a small pitch to be provided on the laser array with ease and with a high degree of freedom is provided. The vertical cavity surface emitting laser array includes a first substrate including a plurality of vertical cavity surface emitting laser devices each having an active layer disposed between reflection mirrors constituting a resonator, and a second substrate including wires for providing electrical contact with the surface emitting laser devices and having a configuration which permits transmission of light emitted from the surface emitting laser devices. In the vertical cavity surface emitting laser array, the second substrate is bonded to the first substrate on the laser emitting side of the first substrate.

11 Claims, 7 Drawing Sheets

VERTICAL CAVITY SURFACE EMITTING LASER ARRAY AND METHOD FOR MANUFACTURING, AND IMAGE FORMING APPARATUS USING VERTICAL CAVITY SURFACE EMITTING LASER ARRAY

BACKGROUND OF THE INVENTION

1. Field of the Invention

The present invention relates to vertical cavity surface emitting laser arrays and methods for manufacturing, and image forming apparatuses using the vertical cavity surface emitting laser arrays.

2. Description of the Related Art

Vertical cavity surface emitting lasers (VCSELs) having resonators formed to be perpendicular to substrate surfaces are known as one configuration of surface emitting lasers. Resonators in VCSELs are composed of two reflector mirrors disposed at opposite sides of active regions to emit beams perpendicular to the substrate surfaces.

For such surface emitting lasers, in general, distributed Bragg reflectors composed of alternately disposed layers of high and low refractive indices are used.

Extensive research and development of VCSELs has been performed since they have the following advantageous features.

Specifically, VCSELs have advantages of low threshold current and low power consumption. In addition, VCSELs have circular spots which facilitate coupling with optical devices and allow production of arrays.

Therefore, VCSELs have been expected to be applied as light sources for optical communication, optical recording, and electrophotography.

For example, for electrophotography, two-dimensionally arrayed surface emitting lasers can realize high-speed printing and high-definition image quality.

In particular, high-speed operation and high-definition images can be achieved by reducing the pitch of VCSEL devices so that many devices are densely arrayed.

However a reduced pitch of VCSEL devices results in spaces of insufficient size in order to provide wires for individually driving the two-dimensionally arrayed VCSEL devices. This makes it difficult to provide such wires.

Japanese Patent Laid-Open No. 2007-5386 discloses a surface emitting layer device with the aim of ensuring spaces of sufficient size in which wires are to be arranged for individually driving two-dimensionally and densely arrayed surface emitting laser devices in a surface emitting laser array while maintaining the size of the devices as practical.

Specifically, a surface emitting laser array disclosed in Japanese Patent Laid-Open No. 2007-5386 has a first mesa structure which includes at least a part of a first reflector mirror and does not include an active layer and a second mesa structure which includes at least an active layer. In this surface emitting laser array, the outer diameter of the second mesa structure is larger than that of the first mesa structure.

In addition, this surface emitting laser array has an electrically connected electrode on the first reflector mirror.

Specifically, as illustrated in FIG. 8, a plurality of devices are separated by forming the first and second mesa structures, and an insulating film is provided over an area except the upper surfaces of the first mesas having the electrodes provided thereon.

Further, by connecting wirings formed on the insulating film to the electrodes provided on the first mesas, the devices in the array can be individually driven.

As described above, in the surface emitting laser array disclosed in Japanese Patent Laid-Open No. 2007-5386, by providing two-stage mesa structure including the first mesa structure and the second mesa structure having different diameters, areas for wiring arrangement are ensured.

On the other hand, a surface emitting device having a wiring arranged on a separate substrate has also been proposed. The separate substrate is provided on the bottom surface of a device, which is a surface opposite to the surface where apertures are provided. Thus, there is an increased degree of freedom in arranging wires on the substrate since no restriction due to the apertures is imposed.

FIG. 9 illustrates a configuration of the surface emitting device disclosed in Japanese Patent Laid-Open No. H11-168262.

As illustrated in FIG. 9, the device has light-emitting regions (VCSELs) 915 each defining the outer diameter of an active layer, and light-emitting layers 916 constituting the active layer itself.

In this surface emitting device, a surface emitting laser array having the plural active layers 916 provided on a semiconductor substrate 901 is bonded to another substrate 912 on which wires can be arranged.

Specifically, the substrate 912 is disposed on the lower surface of the device, which is opposite the surface where apertures are provided.

In the semiconductor substrate 901, which has the apertures, portions of the semiconductor substrate 901, which is an absorber, are selectively removed to expose the apertures, and as a result the semiconductor substrate 901 is left in a frame-like shape that encloses the array area.

However, the techniques described above have the following problems.

For the surface emitting laser array disclosed in Japanese Patent Laid-Open No. 2007-5386, it is necessary to form the two-stage mesa structure and thus complicated fabrication processes are required. In addition, it is difficult to obtain a surface emitting laser having uniform characteristics.

In the surface emitting device disclosed in Japanese Patent Laid-Open No. H11-168262, the other substrate that permits wiring arrangement is disposed on the opposite side to the one where the apertures are provided. Thus, it is necessary to selectively remove portions of the semiconductor substrate, which is an absorber, since the apertures are blocked.

This results in complicated fabrication processes. In addition, it is necessary to attach the surface emitting array to the other substrate that permits wiring arrangement while taking into account the stress applied to the semiconductor substrate that has had portions thereof selectively removed to be formed into a very thin shape.

The present invention has been made in view of the above problems. Accordingly, there is a need for a vertical cavity surface emitting laser array which allows wires for individually driving devices arrayed at a small pitch to be provided on the laser array with ease and a high degree of freedom. There is also need for a method for manufacturing such a vertical cavity surface emitting laser array and an image forming apparatus using the vertical cavity surface emitting laser array.

SUMMARY OF THE INVENTION

A vertical cavity surface emitting laser array according to an exemplary embodiment of the present invention includes a first substrate including a plurality of vertical cavity surface emitting laser devices each having an active layer disposed between reflection mirrors constituting a resonator. The embodiment also includes a second substrate including wires for providing electrical contact with the surface emitting laser devices and having a configuration which permits transmission of light emitted from the surface emitting laser devices, wherein the second substrate is bonded to the first substrate on the laser emitting side of the first substrate.

A method for manufacturing a vertical cavity surface emitting laser array according to an exemplary embodiment of the present invention includes preparing a first substrate including a plurality of vertical cavity surface emitting laser devices each having an active layer disposed between reflection mirrors constituting a resonator. The method also includes preparing a second substrate including wires for providing electrical contact with the surface emitting laser devices and permitting transmission of light emitted from the surface emitting laser devices, and bonding the first substrate and the second substrate together so that the wires formed on the second substrate are electrically connected to electrodes formed on the laser emitting side of the first substrate.

According to an exemplary embodiment of the present invention, a vertical cavity surface emitting laser array is provided which allows wires for individually driving lasers arrayed at a small pitch to be arranged on the vertical cavity surface emitting laser array with ease and a high degree of freedom.

In addition, a manufacturing method of such a vertical cavity surface emitting laser array and an image forming apparatus using the vertical cavity surface emitting laser array can be realized.

Further features of the present invention will become apparent from the following description of exemplary embodiments with reference to the attached drawings.

DESCRIPTION OF THE EMBODIMENTS

Figure 1A:
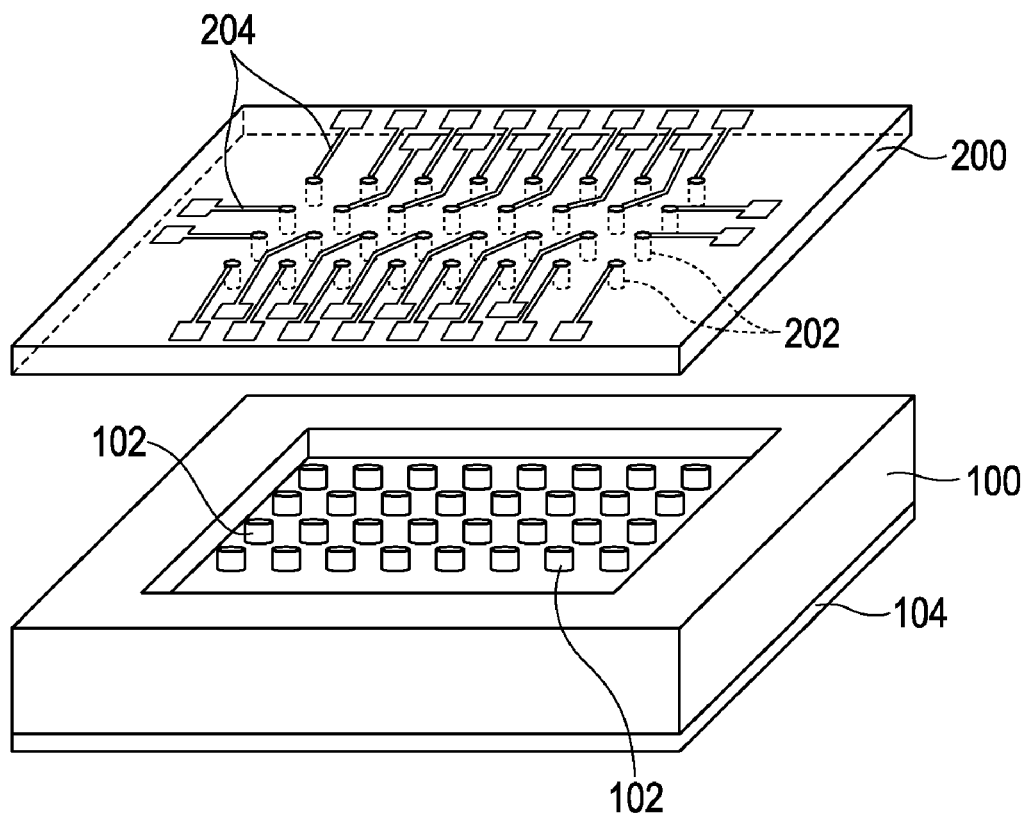
FIGS. 1A and 1B are schematic views illustrating a vertical cavity surface emitting laser array according to a first exemplary embodiment.

In the following, a high-density vertical cavity surface emitting laser array will be described as an exemplary embodiment of the present invention.

A vertical cavity surface emitting laser (VCSEL) array according to an exemplary embodiment, in which devices (surface emitting lasers) are densely arrayed, may have the following configuration for increasing the degree of freedom in arranging wires for individually driving the devices.

Specifically, the VCSEL array includes a first substrate, which is a surface emitting laser array substrate, and a second substrate, which is a wiring substrate on which wires for individually driving the lasers are arranged. The second substrate is bonded to the laser emitting side of the first substrate.

Wires can be arranged on the upper surface of the second substrate, so that the wires can be electrically connected to a metal pad formed on the lower surface of the second substrate through, for example, through-holes for forming electrodes provided in the second substrate.

Then, top electrodes of individual devices of the VCSEL array formed on the laser emitting side of the first substrate are brought into electrical contact with electrode pads formed on the lower surface of the second substrate.

In addition, through-holes for transmitting light are also formed in the second substrate in addition to the above through-holes for forming electrodes. However, when a transparent substrate is used for the second substrate, these light-transmitting through-holes are not necessary.

When such light-transmitting through-holes are formed, they can be used as through-holes for forming electrodes. In this case, it is not necessary to form electrode-forming through-holes in addition to the light-transmitting through-holes.

When the light-transmitting through-holes are formed, the diameter of each light-transmitting through-hole is set to be smaller than the diameter of each device of the VCSEL array. Thus, the spacing between the light-transmitting through-holes is made larger than the spacing between the devices, and the spaces between the light-transmitting through-holes are used as wiring arrangement areas.

With this configuration, the spaces between the light-transmitting through-holes, which are larger than the spaces between the devices, can be used as wiring arrangement areas, and thus the degree of freedom in designing wiring patterns for individually driving surface emitting lasers can be increased.

In addition, in a VCSEL array according to an exemplary embodiment of the present invention, a plurality of light-transmitting through-holes are formed at a spacing larger than the spacing between a plurality of surface emitting laser devices in the first substrate.

In the VCSEL array, areas in which wires are to be arranged are constituted by spaces between the light-transmitting through-holes of the second substrate.

Further, in the VCSEL array, wires are arranged on the upper and lower surfaces of the second substrate, and the wires are electrically connected through the light-transmitting through-holes.

The wires arranged on the upper and lower surfaces of the second substrate can also be electrically connected through through-holes for forming electrodes formed in the second substrate, which are different from the light-transmitting through-holes.

Moreover, in the VCSEL array according to an exemplary embodiment of the present invention, the first substrate and the second substrate are bonded together through a metal member.

The VCSEL array can be an array having m×n (m, n: natural numbers (not including 0)) surface emitting laser devices arrayed in a matrix at a spacing of 15 μm or smaller.

Further, the VCSEL array can be used as a light source for an image forming apparatus.

According to an aspect of the present invention, there is provided for a method for manufacturing a VCSEL array.

The manufacturing method includes processes of preparing a first substrate including a plurality of vertical cavity surface emitting laser devices each having an active layer disposed between reflection mirrors constituting a resonator, preparing a second substrate including wires for providing electrical contact with the surface emitting laser devices and permitting transmission of light emitted from the surface emitting laser devices, and bonding the first substrate and the second substrate together so that the wires of the second substrate are electrically connected to electrodes formed on the laser emitting side of the first substrate.

In this method, in order to enable transmission of light emitted from the surface emitting laser devices, a plurality of light-transmitting through-holes in the second substrate are formed. At this time, the spacing between the light-transmitting through-holes is made larger than the spacing between the surface emitting laser devices in the first substrate.

In addition, the method further includes a process of forming through-holes for forming electrodes in the second substrate.

According to the present invention, compared with a case where wires for individually driving lasers are arranged on the first substrate, large areas in which the wires are to be arranged can be achieved.

As a result, the degree of freedom in design of wiring arrangement can be increased. In addition, by implementing the VCSEL array having the above configuration in an image forming apparatus, an image forming apparatus capable of high-speed, high-definition printing can be realized.

In the following, the exemplary embodiments of the present invention will be described in more detail.

First Exemplary Embodiment

A vertical cavity surface emitting laser array according to a first exemplary embodiment of the present invention will be described.

Figure 1B:
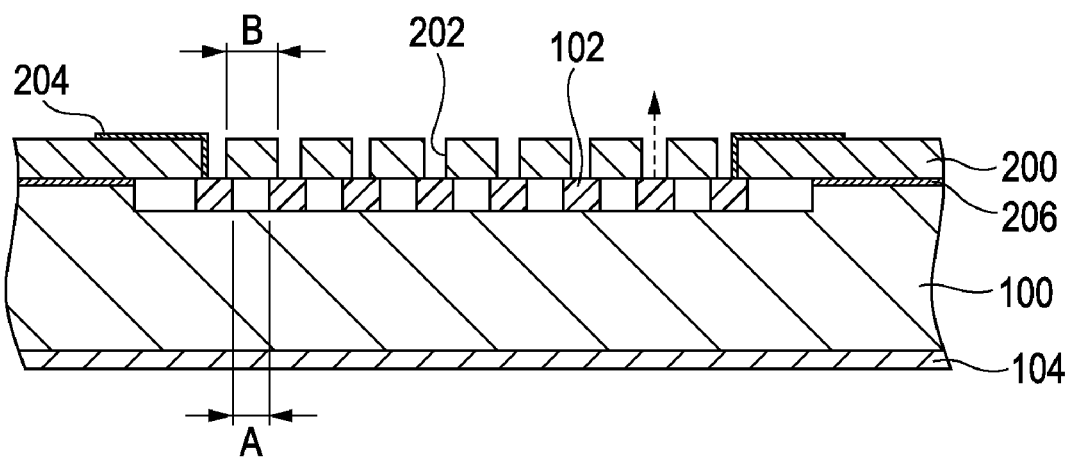

FIGS. 1A and 1B illustrate a vertical cavity surface emitting laser array (hereinafter also referred to as a VCSEL array) according to the first exemplary embodiment.

As illustrated in FIGS. 1A and 1B, the VCSEL array has a surface emitting laser array substrate (first substrate) 100, surface emitting laser devices 102, a common electrode 104, a wiring substrate (second substrate) 200, through-holes for transmitting light (hereinafter referred to as light-transmitting through-holes) 202 allowing transmission of light, wires for individually driving the surface emitting laser devices (hereinafter also referred to as individual-driving wires) 204, and a bonding metal member 206.

In addition, as illustrated in FIG. 1B, a spacing between the surface emitting laser devices 102 is represented by A, and a spacing between light-transmitting through-holes 202 is represented by B.

In the VCSEL array according to this exemplary embodiment, the surface emitting laser array substrate (first substrate) 100 and the wiring substrate (second substrate) 200 are bonded together.

In this array, the diameter of each of the light-transmitting through-holes 202 is formed to be smaller than the diameter of each of the surface emitting laser devices 102, so that the spacing B between the light-transmitting through-holes 202 is larger than the spacing A between the devices 102. The spacing B corresponds to the width of a wiring arrangement area.

In this way, an area having a width larger than the device spacing A is used as a wiring arrangement area. This can increase the degree of freedom in arranging wires for individually driving surface emitting lasers.

In the following, processes for manufacturing the VCSEL array according to this exemplary embodiment will be described with reference to FIGS. 2A to 2D, FIGS. 3A to 3D, and FIG. 4.

Note that in each of the figures, a part of a substrate is illustrated.

FIGS. 2A to 2D are schematic views illustrating manufacturing processes of the surface emitting laser array substrate.

FIGS. 3A to 3D are schematic views illustrating manufacturing processes of the wiring substrate.

Figure 4:
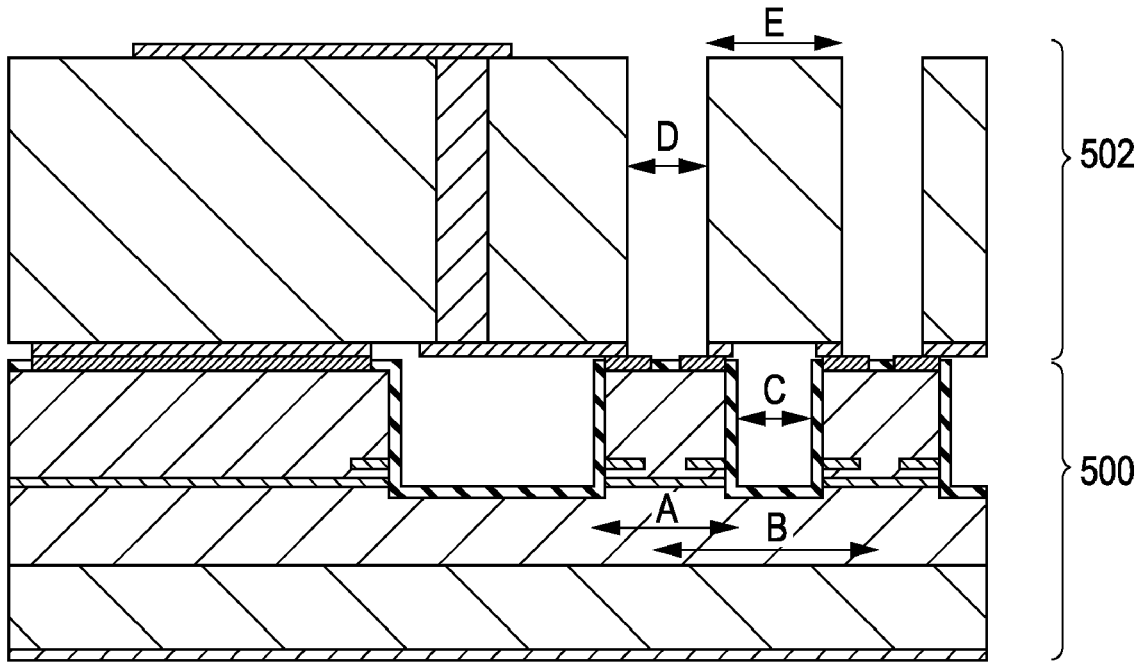
FIG. 4 is a schematic view illustrating a manufacturing process of the vertical cavity surface emitting laser array according to the first exemplary embodiment.

FIG. 4 is a schematic view illustrating a VCSEL array an exemplary embodiment of the present invention having the surface emitting laser array substrate and the wiring substrate that are bonded together.

In FIGS. 2A to 2D, the surface emitting laser array substrate includes an n-type GaAs substrate 300, a semiconductor epitaxial layer 302, an active layer 304, mesas 306, a current confinement structure 308, an insulating film 310, a p-side electrode 312, a bonding metal member 314, and an n-side electrode 316.

First, referring to FIGS. 2A to 2D, processes of preparing the first substrate having a plurality of VCSEL devices each having an active layer between reflection mirrors constituting a resonator are described.

Figure 2A:
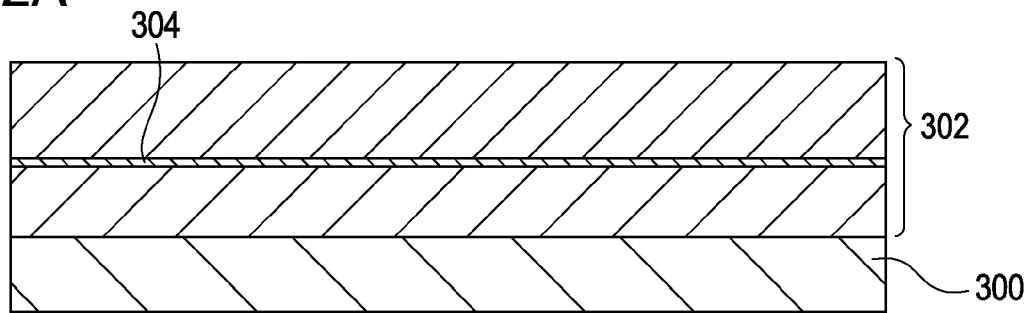
FIGS. 2A to 2D are schematic views illustrating manufacturing processes of the vertical cavity surface emitting laser array according to the first exemplary embodiment.

As illustrated in FIG. 2A, the semiconductor epitaxial layer 302 is grown on the GaAs substrate 300 via a buffer layer using an MOCVD (metal-organic chemical vapor deposition) apparatus, as described below.

An n-type AlGaInP spacer layer and the active layer 304 of GaInP/AlGaInP-MQW are grown on an n-type $Al_{0.9}Ga_{0.1}As/Al_{0.5}Ga_{0.5}As$-DBR mirror layer.

Then, a p-type AlGaInP spacer layer, a p-type $Al_{0.98}Ga_{0.02}As$ layer, a p-type $Al_{0.9}Ga_{0.1}As/Al_{0.5}Ga_{0.5}As$-DBR mirror layer, and a p-type GaAs contact layer are sequentially grown on the active layer 304.

Figure 2B:
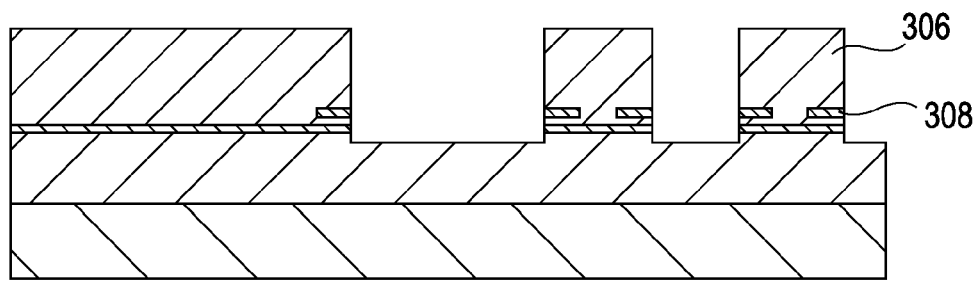

Subsequently, as illustrated in FIG. 2B, the mesas 306 are formed using lithography and dry etching techniques such that the n-type $Al_{0.9}Ga_{0.1}As/Al_{0.5}Ga_{0.5}As$-DBR mirror layer is exposed.

Then, the p-type $Al_{0.98}Ga_{0.02}As$ layer is selectively oxidized in a water vapor atmosphere so that the current confinement structure 308 is formed.

Figure 2C:
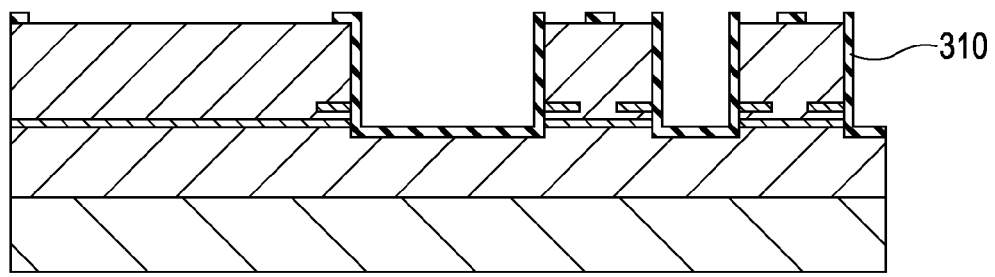

Then, as illustrated in FIG. 2C, the insulating film (silicon oxide film) 310 is formed using a CVD growth, lithography, and etching techniques.

Figure 2D:
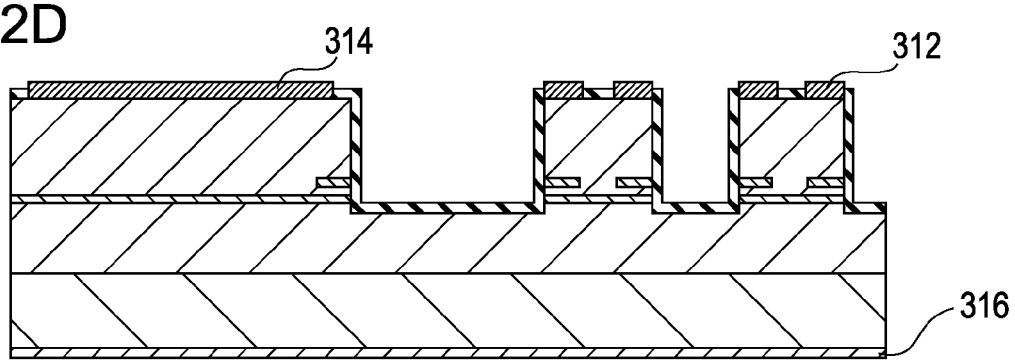

Subsequently, as illustrated in FIG. 2D, the p-side electrode (Ti/Au) 312 and the bonding metal member (Ti/Au) 314 are formed using lithography and metal deposition techniques.

In addition, the n-side electrode (AuGe/Ni/Au) 316 is formed on the n-type GaAs substrate 300 using a metal deposition technique.

In the following, referring to FIGS. 3A to 3D, processes for preparing the second substrate which has wires for providing electrical contact with the surface emitting laser devices and allows transmission of light emitted from the surface emitting laser devices are described.

As illustrated in FIGS. 3A to 3D, the second substrate includes a substrate 400, light-transmitting through-holes 402, a through-hole for forming an electrode (hereinafter also referred to as an electrode-forming through-hole) 404, an upper-surface wiring metal 406, a lower-surface wiring metal 408, a bonding metal member 410, and a through-electrode 412.

Figure 3A:
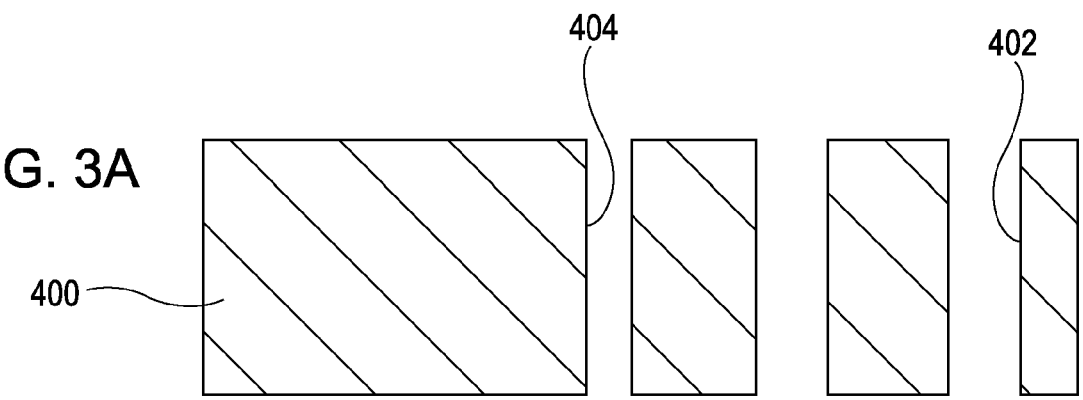
FIGS. 3A to 3D are schematic views illustrating manufacturing processes of the vertical cavity surface emitting laser array according to the first exemplary embodiment.

First, as illustrated in FIG. 3A, the light-transmitting through-holes 402 and the electrode-forming through-hole 404 are formed in the Si substrate 400 using lithography and dry etching techniques.

Figure 3B:
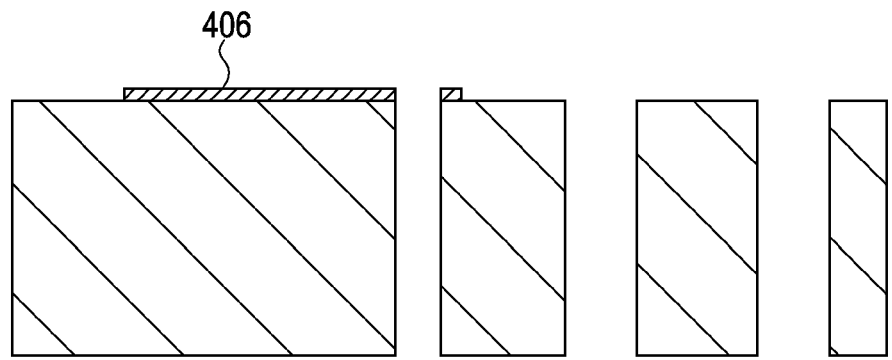

Then, as illustrated in FIG. 3B, the wiring metal (Ti/Au) 406 is formed on the upper surface of the Si substrate 400 using lithography and metal deposition techniques.

Figure 3C:
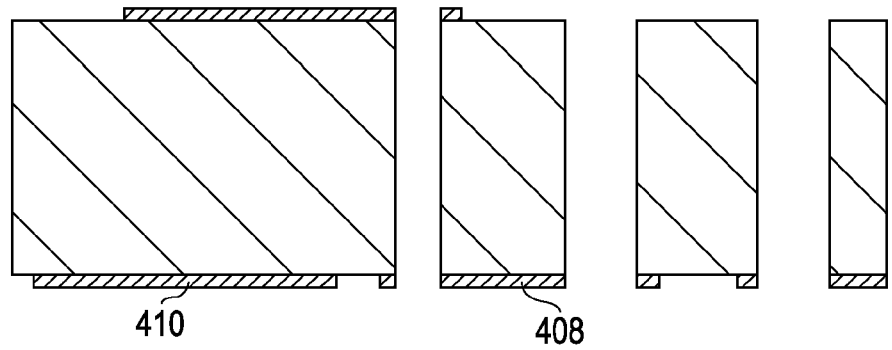

Subsequently, as illustrated in FIG. 3C, the wiring metal (Ti/Au) 408 and the bonding metal member (Ti/Au) 410 are formed on the lower surface of the Si substrate 400 using lithography and metal deposition techniques.

Figure 3D:
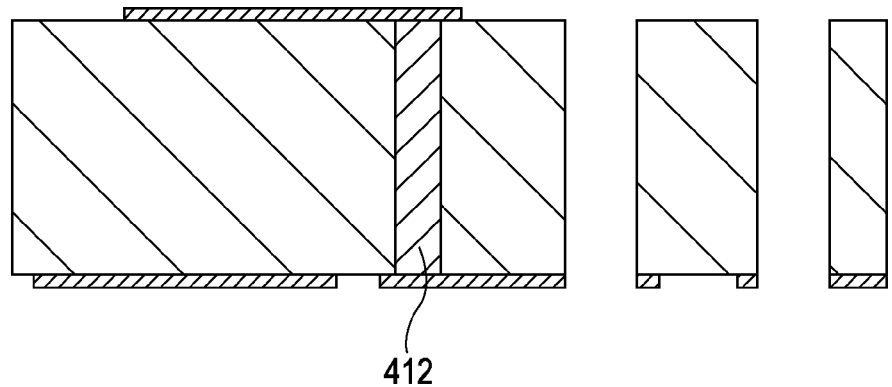

Then, as illustrated in FIG. 3D, the through-electrode 412 is formed using a plating technique.

FIG. 4 shows a surface emitting laser array substrate 500 and a wiring substrate 502.

As illustrated in FIG. 4, the surface emitting laser array substrate 500 and the wiring substrate 502, which have been manufactured through the processes illustrated in FIGS. 2A to 2D and FIGS. 3A to 3D, are bonded to each other by direct bonding (Au—Au bonding).

In this way, a VCSEL array in which wires for individually driving surface emitting lasers are arranged in a substrate different from a substrate on which the VCSEL array is formed can be obtained.

FIG. 4 also indicates a diameter A of each mesa, a pitch B of mesas, a spacing C between mesas, a diameter D of each light-transmitting through-hole, and a wiring area E.

The VCSEL array in this exemplary embodiment is an 8×4 VCSEL array having a mesa diameter A of 30 µm, a mesa pitch B of 40 µm, a mesa spacing C of 10 µm, a light-transmitting through-hole diameter D of 18 µm, and a wiring area E of 22 µm.

In this exemplary embodiment, the diameter of an aperture of each surface emitting laser is set to 6 µm.

In addition, the thickness of the insulating film 310 is set to one-half of an oscillation wavelength $\lambda$.

In addition, the thickness of the Si substrate of the wiring substrate is set to 50 µm.

Thus, in this exemplary embodiment, processes are employed for forming a plurality of light-transmitting through-holes from which light emitted from surface emitting laser devices is transmitted, at a spacing larger than the spacing between the surface emitting laser devices.

With the above configuration, the following effects are obtained using an m×n (m, n: natural numbers (not including 0)) VCSEL with a spacing between individual surface emitting laser devices of 15 µm or smaller.

Specifically, when a surface emitting laser array substrate and a wiring substrate having wires for individually driving surface emitting lasers are manufactured and bonded together, the diameter of each light-transmitting through-hole is set to be smaller than the diameter of each device in the VCSEL array.

Thus, the spacing between the light-transmitting through-holes is larger than the spacing between the devices. This makes it possible to ensure that large areas are provided on the wiring substrate in which individual-driving wires are to be arranged.

As a result, compared with a known technique in which wirings for individually driving surface emitting lasers are arranged on a surface emitting laser substrate, the above arrangement can increase the degree of freedom in designing wiring patterns, as described below.

In the case of the related art, when wires are arranged on a surface emitting laser array substrate with surface emitting laser devices arrayed at a spacing of 10 µm, the width of a wiring area is equal to the device spacing (10 µm).

On the other hand, with the configuration according to this exemplary embodiment, in which a wiring substrate and a surface emitting laser array substrate are bonded together, when the spacing between light-transmitting through-holes is 22 µm, the width of a wiring area is equal to the light-transmitting through-hole spacing (22 µm).

With this arrangement, the degree of freedom in design of wiring patterns can be increased.

The present exemplary embodiment has been described above using the case of a 680 nm wavelength VCSEL. However, the exemplary embodiment is not limited to the case, and can be applied to VCSELs for a wavelength of 850 nm (GaAs/AlGaAs active layer) or the like.

In addition, in the above exemplary embodiment, the wiring substrate is formed by processing a Si substrate. However, the exemplary embodiment is not limited to this case, and the wring substrate may be made of a resin material, a metal material, or a semiconductor material other than Si.

In particular, by using a material having a low thermal resistance, heat generated in the active layer of a surface emitting laser can be effectively dissipated.

In addition, techniques (apparatuses) used for growth, lithography, etching, and vapor deposition as illustrated in this exemplary embodiment are not limited to those described above, and any technique (apparatus) that provides the same effect may be employed.

Second Exemplary Embodiment

In the following, a second exemplary embodiment of a VCSEL array in which through electrodes for electrically connecting wires arranged in the upper and lower surfaces of a wiring substrate are formed in light-transmitting through-holes will be described.

Figure 5:
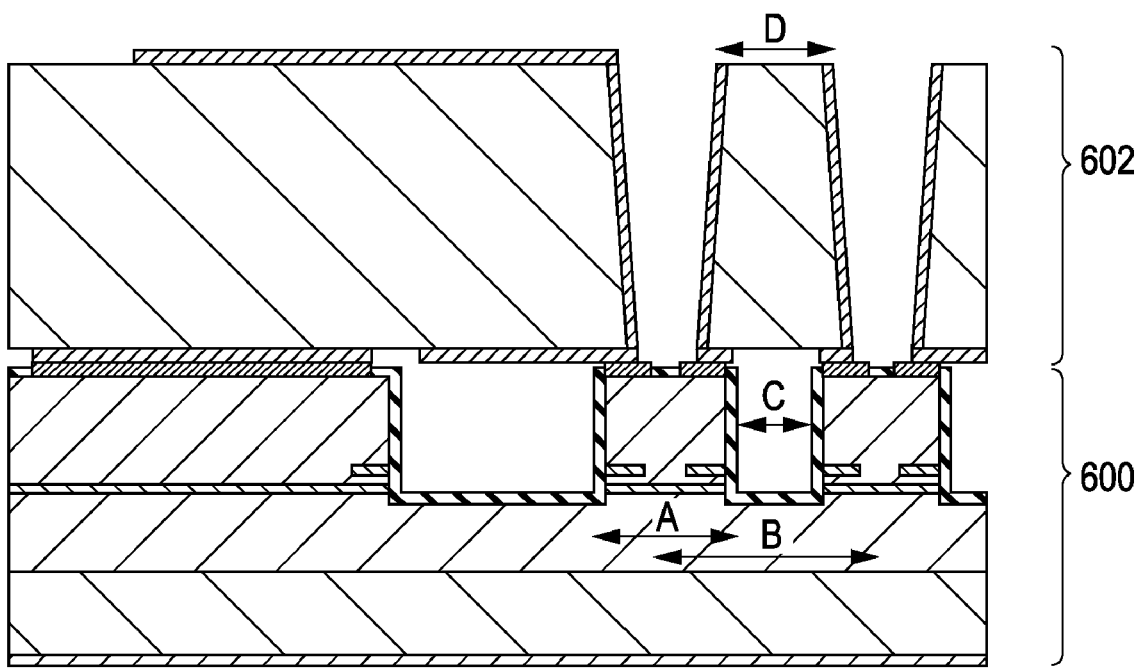
FIG. 5 is a schematic view illustrating a vertical cavity surface emitting laser array according to a second exemplary embodiment.

FIG. 5 is a schematic view illustrating a VCSEL array according to the second embodiment.

As illustrated in FIG. 5, the VCSEL array includes a surface emitting laser array substrate 600 and a wiring substrate 602.

In the VCSEL array in this exemplary embodiment, through-electrodes for electrically connecting wires arranged on the upper surface of the wiring substrate and wires arranged on the lower surface of the wiring substrate are formed in light-transmitting through-holes.

In the following, processes for manufacturing such a VCSEL array will be described.

In this exemplary embodiment, the same surface emitting laser array substrate as that used in the first exemplary embodiment is used.

Figure 6A:
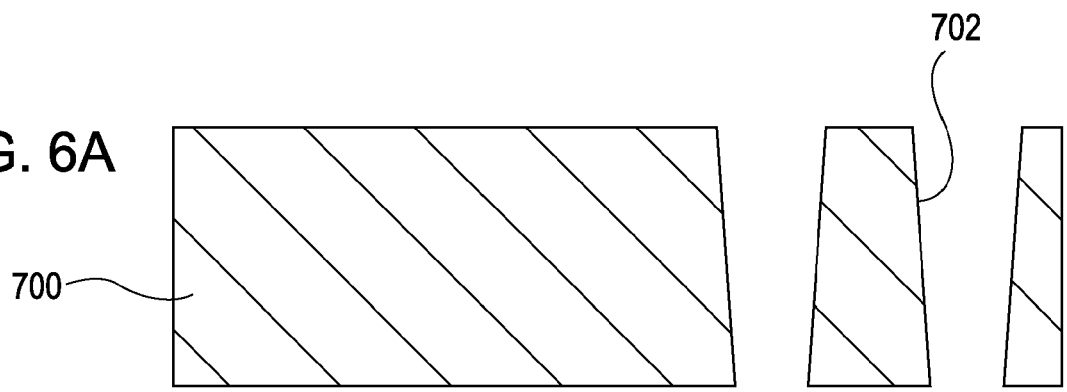
FIGS. 6A to 6C are schematic views illustrating manufacturing processes of the vertical cavity surface emitting laser array according to the second exemplary embodiment.
Figure 6B:
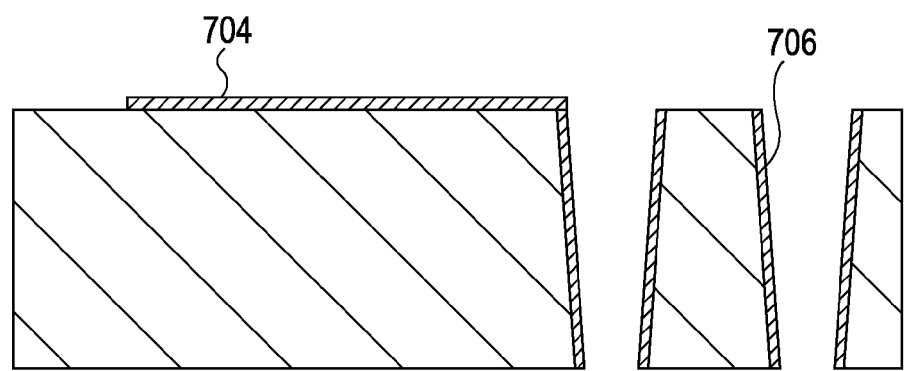
Figure 6C:
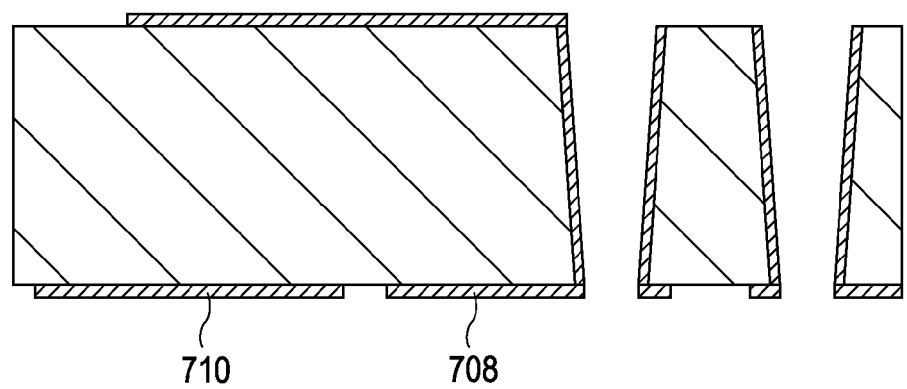

FIGS. 6A to 6C are schematic views illustrating processes for manufacturing a wiring substrate according to this exemplary embodiment.

As illustrated in FIGS. 6A to 6C, the wiring substrate includes a substrate 700, light-transmitting through-holes 702, an upper-surface wiring metal 704, a through-electrode 706, a lower-surface wiring metal 708, and a bonding metal member 710.

First, as illustrated in FIG. 6A, the light-transmitting through-holes 702 are formed in the Si substrate 700 using lithography and dry etching techniques.

Then, as illustrated in FIG. 6B, using lithography and metal deposition techniques, the upper-surface wiring metal (Ti/

Au) 704 is formed on the upper surface of the Si substrate 700 and the through-electrode (Ti/Au) 706 is formed.

Subsequently, as illustrated in FIG. 6C, using lithography and metal deposition techniques, the lower-surface wiring metal (Ti/Au) 708 and the bonding metal member (Ti/Au) 710 are formed on the lower surface of the Si substrate 700.

As illustrated in FIG. 5, the surface emitting laser array substrate 600 and the wiring substrate 602, which have been manufactured through processes illustrated in FIGS. 2A to 2D and FIGS. 6A to 6C, are bonded together by direct bonding (Au—Au bonding).

The processes described above enables fabrication of a VCSEL array in which wires for individually driving surface emitting lasers in the VCSEL array are arranged on a substrate different from the substrate having the surface emitting laser array formed thereon can be realized.

FIG. 5 also indicates a dimension A of each mesa, a mesa pitch B, a mesa spacing C, and a wiring area D.

The VCSEL array of this exemplary embodiment is an 8×4 VCSEL array having a mesa diameter A of 30 μm, a mesa pitch B of 40 μm, a mesa spacing C of 10 μm, and a wiring space D of 18 μm.

In this exemplary embodiment, the diameter of an aperture of each surface emitting laser is set to 6 μm.

The thickness of the insulating film 310 is set to one-half of an oscillation wavelength λ.

In addition, the thickness of the Si substrate of the wiring substrate is set to 50 μm.

With the above configuration, the following effects are obtained using an m×n (m, n: natural numbers (not including 0)) VCSEL with a spacing between individual surface emitting laser devices of 15 μm or smaller.

Specifically, when a surface emitting laser array substrate and a wiring substrate having wires for individually driving surface emitting lasers are manufactured and bonded together, the diameter of each light-transmitting through-hole is set to be smaller than the diameter of each device in the VCSEL array.

Thus, the spacing between the light-transmitting through-holes is larger than the spacing between the devices. This makes it possible to ensure that large areas are provided on the wiring substrate in which individual-driving wires are to be arranged.

As a result, compared with a known technique in which wires for individually driving surface emitting lasers are arranged on a surface emitting laser substrate, the above arrangement can increase the degree of freedom in designing wiring patterns, as described below.

In the case of the related art, when wires are arranged on a surface emitting laser array substrate with surface emitting laser devices arrayed at a spacing of 10 μm, the width of a wiring area is equal to the device spacing (10 μm).

On the other hand, with the configuration of this exemplary embodiment, in which a wiring substrate and a surface emitting laser array substrate are bonded together, when the spacing between light-transmitting through-holes is 18 μm, the width of a wiring area is equal to the light-transmitting through-hole spacing (18 μm). This arrangement can increase the degree of freedom in design of wiring patterns.

The present exemplary embodiment has been described above using the case of a 680 nm wavelength VCSEL. However, the exemplary embodiment is not limited to that case, and can be applied to VCSELs for a wavelength of 850 nm (GaAs/AlGaAs active layer) or the like, as in the case of the first exemplary embodiment.

In addition, in this exemplary embodiment, the materials, the manufacturing processes (including apparatuses), etc. used for the substrates in the first exemplary embodiment may also be used as necessary.

Third Exemplary Embodiment

In the following, an application example of a VCSEL array according to an exemplary embodiment of the present invention will be described.

Figure 7A:
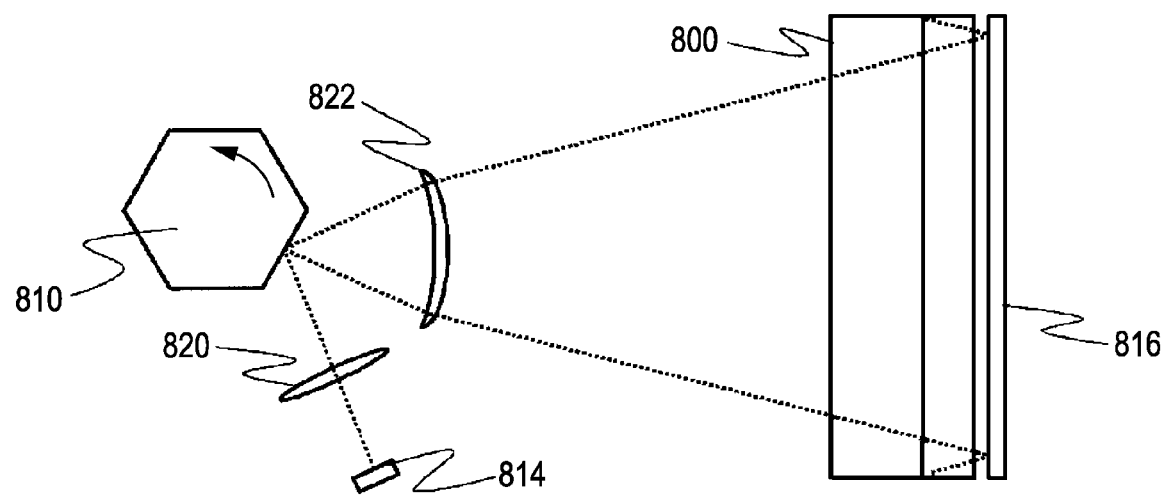
FIGS. 7A and 7B are schematic views illustrating a configuration of an image forming apparatus according to a third exemplary embodiment which has a vertical cavity surface emitting laser array and implements an electrophotographic recording system.
Figure 7B:
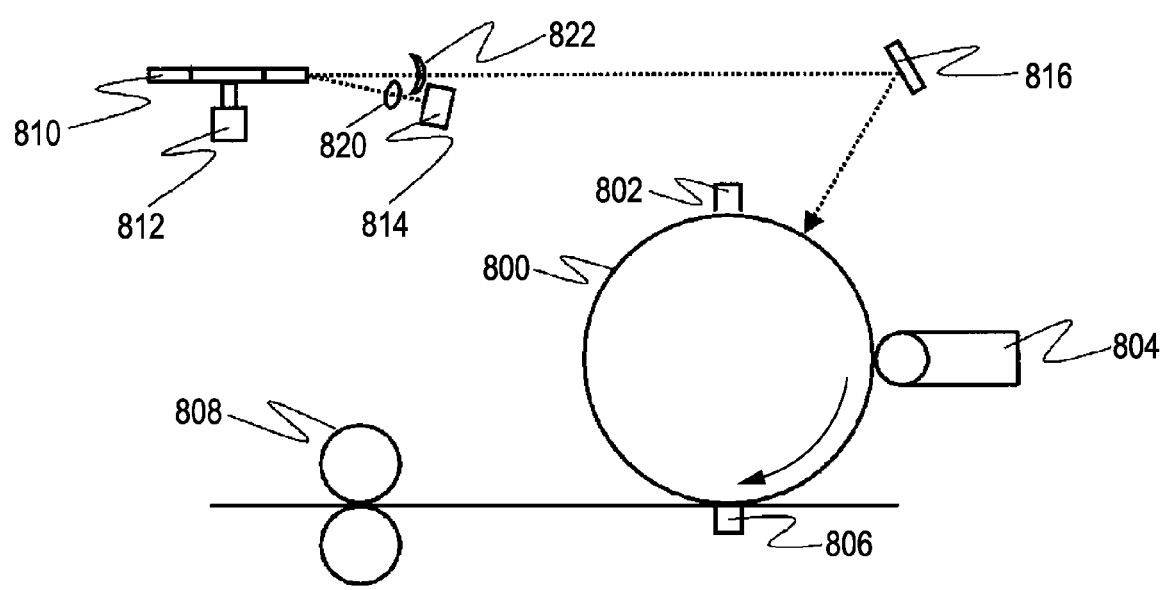
Figure 8:
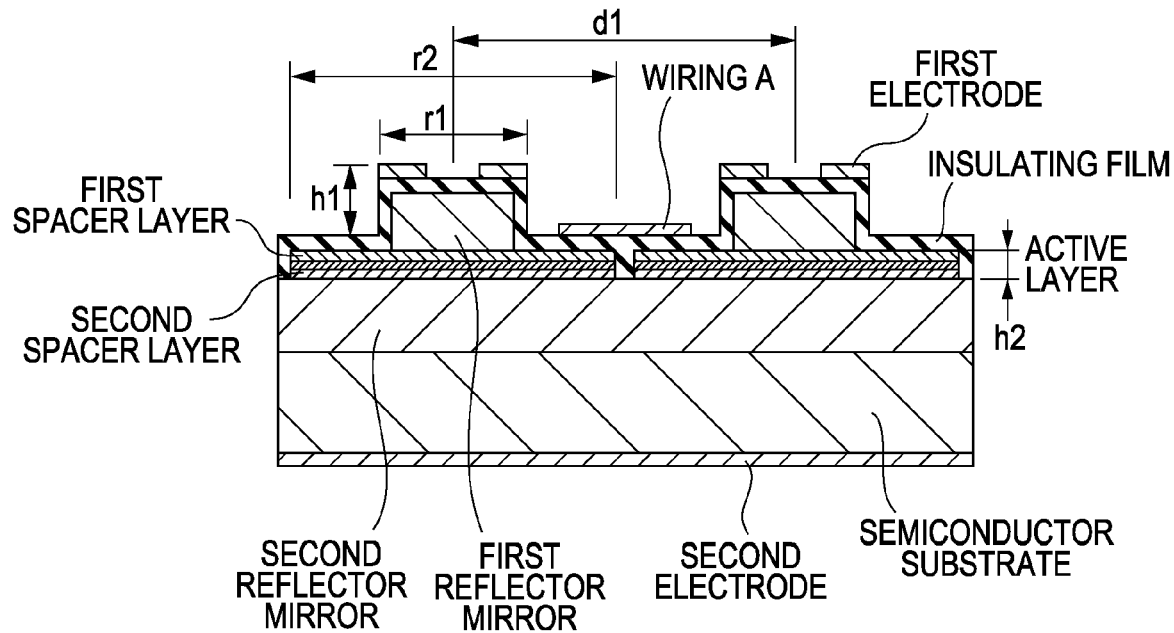
FIG. 8 is a schematic diagram illustrating a surface emitting laser device in an example of the related art.
Figure 9:
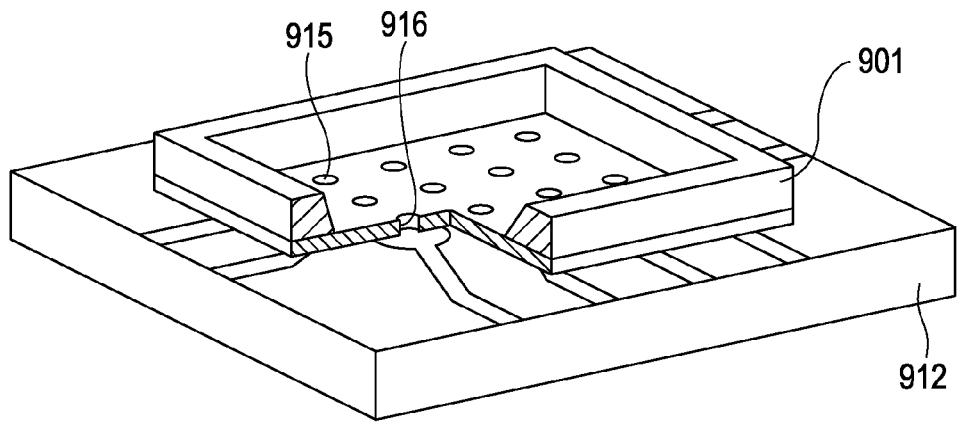
FIG. 9 is a schematic diagram illustrating a surface emitting device in an example of the related art.

FIGS. 7A and 7B illustrate a structure of an image forming apparatus which implements a VCSEL array according to an exemplary embodiment of the present invention and an electrophotographic recording system.

FIGS. 7A and 7B are side views of the image forming apparatus.

As illustrated in FIGS. 7A and 7B, the image forming apparatus includes a photosensitive drum 800, a charger 802, a developing unit 804, a transfer charger 806, a fixing unit 808, a rotatable polygon mirror 810, a motor 812, a VCSEL array 814, a reflector 816, a collimator lens 820, and an f-θ lens 822.

The motor 812 drives the rotatable polygon mirror 810.

The rotatable polygon mirror 810 in this exemplary embodiment has six reflecting surfaces.

The VCSEL array 814 serves as a recording light source and is configured to be turned on and off by operation of a laser driver (not shown) in accordance with image signals.

The thus optically modulated laser beam is emitted from the VCSEL array 814 to the rotatable polygon mirror 810 through the collimator lens 820.

The rotatable polygon mirror 810 rotates in the direction indicated by the arrow in FIG. 7A. The laser beam emitted from the VCSEL array 814 is incident on the reflecting surfaces of the rotatable polygon mirror 810 and reflected as deflected beams during the rotation of the rotatable polygon mirror 810.

The reflected beam undergoes distortion correction or the like by the f-θ lens 822 and is incident on the photosensitive drum 800 via the reflector 816 to scan the photosensitive drum 800 in the main scanning direction.

At this time, by the reflection of the beam from one reflecting surface of the rotatable polygon mirror 810, an image representing a plurality of lines corresponding to the VCSEL array 814 is formed in the main scanning direction of the photosensitive drum 800.

The VCSEL array 814 in this exemplary embodiment is a 4×8 VCSEL array and an image corresponding to four lines is formed using the VCSEL array 814.

The photosensitive drum 800 is charged beforehand by the charger 802 and sequentially exposed by the scanning laser light. As a result, an electrostatic latent image is formed.

In addition, the photosensitive drum 800 rotates in the direction indicated by an arrow in FIG. 7B. The electrostatic latent image is developed by the developing unit 804, and the developed visible image is transferred onto transfer paper (not shown) by the transfer charger 806.

Then, the transfer paper with the transferred visible image is conveyed to the fixing unit 808 to be fixed and is then ejected from the image forming apparatus.

A beam detect sensor (hereinafter referred to as a BD sensor) (not shown) is disposed at a side portion of the photosensitive drum 800 near a scanning start position in the main scanning direction.

The laser beam reflected on each reflecting surface of the rotatable polygon mirror 810 is detected by the BD sensor prior to line scanning.

A signal detected by the BD sensor is input to a timing controller (not shown) as a scan start reference signal in the main scanning direction. This detected signal is used as the reference for synchronization of a writing start position of each line in the main scanning direction.

While in this exemplary embodiment, a 4×8 VCSEL array is used, any m×n (m, n: natural numbers (not including 0)) VCSEL array can be employed.

As described above, by applying a VCSEL array according to an exemplary embodiment of the present invention to an image forming apparatus implementing an electrophotographic recording system, an image forming apparatus capable of high-speed, high-definition printing can be realized.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2007-176969 filed on Jul. 5, 2007, which is hereby incorporated by reference herein in its entirety.

What is claimed is:

1. A vertical cavity surface emitting laser array comprising:
a first substrate including a plurality of vertical cavity surface emitting laser devices each having an active layer disposed between reflection mirrors constituting a resonator; and
a second substrate including wires for providing electrical contact with the plurality of surface emitting laser devices and having a configuration that permits transmission of light emitted from the plurality of surface emitting laser devices,
wherein the second substrate is bonded to the first substrate on a laser emitting side of the first substrate, and
wherein the wires are formed on an upper surface and a lower surface of the second substrate and are electrically connected through electrode-forming through-holes provided in the second substrate, the electrode-forming through-holes being different from light-transmitting through-holes formed in the second substrate.

2. The vertical cavity surface emitting laser array of claim 1, wherein the configuration that permits transmission of light emitted from the plurality of surface emitting laser devices is formed by a plurality of light-transmitting through-holes including the light-transmitting through-holes provided in the second substrate.

3. The vertical cavity surface emitting laser array of claim 2, wherein a spacing between through-holes of the plurality of light-transmitting through-holes is larger than a spacing between devices of the plurality of surface emitting laser devices in the first substrate.

4. The vertical cavity surface emitting laser array of claim 3, wherein areas in which the wires are to be arranged are constituted by spaces between the light-transmitting through-holes in the second substrate.

5. The vertical cavity surface emitting laser array of claim 2, wherein the wires are formed on an upper surface and a lower surface of the second substrate and the wires are electrically connected through the light-transmitting through-holes.

6. The vertical cavity surface emitting laser array of claim 1, wherein the first substrate and the second substrate are bonded together via a metal member.

7. The vertical cavity surface emitting laser array of any one of claims 1, 2, 3, 4, 5, and 6, wherein m×n surface emitting laser devices are provided, where m and n are natural numbers not including 0, and a spacing between devices of the plurality of surface emitting laser devices is 15 μm or smaller.

8. A vertical cavity surface emitting laser array according to claim 1, wherein the vertical cavity surface emitting laser array is incorporated in an image forming apparatus as a light source.

9. The vertical cavity surface emitting laser array according to claim 8, wherein the image forming apparatus is included in an electrophotographic recording system.

10. A method for manufacturing a vertical cavity surface emitting laser array, the method comprising:
preparing a first substrate including a plurality of vertical cavity surface emitting laser devices each having an active layer disposed between reflection mirrors constituting a resonator;
preparing a second substrate including wires for providing electrical contact with the plurality of surface emitting laser devices and permitting transmission of light emitted from the plurality of surface emitting laser devices;
bonding the first substrate and the second substrate together so that the wires formed on the second substrate are electrically connected to electrodes formed on a laser emitting side of the first substrate; and
forming electrode-forming through-holes in the second substrate, the electrode-forming through-holes being different from light-transmitting through-holes formed in the second substrate.

11. The method of claim 10, further comprising providing a plurality of light-transmitting through-holes including the light-transmitting through-holes formed in the second substrate for permitting transmission of light emitted from the plurality of surface emitting laser devices, in which a spacing between holes of the plurality of light-transmitting through-holes is set to be larger than a spacing between devices of the plurality of surface emitting laser devices in the first substrate.

* * * * *